(12) United States Patent
Hou et al.

(10) Patent No.: US 12,077,870 B2
(45) Date of Patent: Sep. 3, 2024

(54) MASK MANUFACTURING METHOD AND MASK MANUFACTURING DEVICE

(71) Applicant: DARWIN PRECISIONS CORPORATION, Hsinchu County (TW)

(72) Inventors: Kuan-Ting Hou, Hsinchu County (TW); Syue-Wun Fu, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 25 days.

(21) Appl. No.: 17/578,502

(22) Filed: Jan. 19, 2022

(65) Prior Publication Data

US 2022/0364241 A1 Nov. 17, 2022

(30) Foreign Application Priority Data

May 14, 2021 (TW) .................................. 110117395

(51) Int. Cl.
C23C 14/04 (2006.01)
C23C 14/24 (2006.01)
C23F 1/02 (2006.01)

(52) U.S. Cl.
CPC .............. *C23F 1/02* (2013.01); *C23C 14/042* (2013.01); *C23C 14/24* (2013.01)

(58) Field of Classification Search
None
See application file for complete search history.

(56) References Cited

U.S. PATENT DOCUMENTS

| 5,221,428 A * | 6/1993 | Ohsawa | H01L 23/49531 |
| | | | 257/E23.041 |
| 2005/0133156 A1* | 6/2005 | Kim | H01L 21/30604 |
| | | | 156/345.12 |

FOREIGN PATENT DOCUMENTS

| CN | 104888996 A | 9/2015 |
| CN | 107916396 A | 4/2018 |
| CN | 110965021 A | 4/2020 |
| CN | 111066169 A | 4/2020 |
| TW | 436843 B | 5/2001 |
| TW | 201708590 A | 3/2017 |

* cited by examiner

*Primary Examiner* — Shamim Ahmed
*Assistant Examiner* — Bradford M Gates (57) ABSTRACT

A mask manufacturing method includes a step of providing a metal substrate having a plurality of virtual zones on its surface, using a plurality of nozzles to spray an etching solution on the surface, wherein the virtual zones include a first and a second zone, and the metal substrate has a first thickness and a second thickness respectively in an unit area of the first zone and the second zone, wherein the first thickness is greater than the second thickness; the step of using the nozzles to spray the etching solution on the surface further includes respectively using a first spraying pressure and a second spraying pressure to spray the etching solution on the first zone and the second zone, and the first spraying pressure is greater than the second spraying pressure. The invention also provides a mask manufacturing device.

14 Claims, 6 Drawing Sheets

| providing a metal substrate having a plurality of virtual zones on the surface of the metal substrate, wherein the virtual zones include a first zone and a second zone, the metal substrate has a first thickness in a unit area of the first zone and has a second thickness in a unit area of the second zone, and the first thickness is greater than the second thickness | ~S110 |

| using a plurality of nozzles to spray an etching solution on the surface of the metal substrate, in which further includes a step of: using a first spraying pressure to spray the etching solution on the first zone and using a second spraying pressure to spray the etching solution on the second zone, wherein the first spraying pressure is greater than the second spraying pressure | ~S120 |

| providing a metal substrate having a plurality of virtual zones on the surface of the metal substrate, wherein the virtual zones include a first zone and a second zone, the metal substrate has a first thickness in a unit area of the first zone and has a second thickness in a unit area of the second zone, and the first thickness is greater than the second thickness | ~ S110 |

| using a plurality of nozzles to spray an etching solution on the surface of the metal substrate, in which further includes a step of: using a first spraying pressure to spray the etching solution on the first zone and using a second spraying pressure to spray the etching solution on the second zone, wherein the first spraying pressure is greater than the second spraying pressure | ~ S120 |

| forming a thinned metal plate having a thickness difference less than 1.2 $\mu$m between different unit areas | ~ S130 |

MASK MANUFACTURING METHOD AND MASK MANUFACTURING DEVICE

FIELD OF THE INVENTION

The present invention relates to a mask manufacturing method, and more particularly to a metal mask manufacturing method and a metal mask manufacturing device.

BACKGROUND OF THE INVENTION

The manufacture of a metal mask for evaporation such as a fine metal mask includes processes such as photoresist coating, exposure, development, and etching, etc., to form a plurality of openings on the metal material. However, due to the thickness difference of the metal material itself, the degree of etching is uneven, which causes the formed openings have different sizes and even different shapes. Such poor reliability reduces the quality of the mask and may cause the accumulation of errors, thereby causing unpredictable adverse effects on the manufacturing process involved in the mask.

SUMMARY OF THE INVENTION

The present invention provides a mask manufacturing method to improve the uniformity of the openings and the quality of the mask.

The mask manufacturing method provided by the present invention includes steps of: providing a metal substrate having a plurality of virtual zones on a first surface; and using a plurality of nozzles to spray an etching solution on the first surface of the metal substrate. The virtual zones include a first zone and a second zone. The metal substrate has a first thickness in a unit area of the first zone and has a second thickness in a unit area of the second zone, and the first thickness is greater than the second thickness. The step of using the nozzles to spray the etching solution on the first surface of the metal substrate further includes a step of: using a first spraying pressure to spray the etching solution on the first zone and using a second spraying pressure to spray the etching solution on the second zone, wherein the first spraying pressure is greater than the second spraying pressure.

In an embodiment of the present invention, the virtual zones are arranged and adjacently connected along a first direction. The nozzles spray the etching solution and respectively have a spraying range on the first surface of the metal substrate, the spraying ranges respectively correspond to the virtual zones, and the adjacent spraying ranges are adjacently connected to each other.

In an embodiment of the present invention, the spraying ranges are arranged and adjacently connected along a second direction, the second direction has a component in the first direction and a component in a third direction, and the third direction is perpendicular to the first direction.

In an embodiment of the present invention, the spraying ranges are substantially circular, and the adjacent spraying ranges are overlapped at a position where the adjacent spraying ranges are adjacently connected.

In an embodiment of the present invention, an amount of the etching solution sprayed by the first spraying pressure is greater than an amount of the etching solution sprayed by the second spraying pressure.

In an embodiment of the present invention, centers of the two adjacent spraying ranges in the first direction are 75-85 mm apart.

In an embodiment of the present invention, centers of the two adjacent spraying ranges in the second direction are 120-145 mm apart.

In an embodiment of the present invention, an angle between the first direction and the second direction is $\theta$, and $\tan\theta$ is greater than 3 or less than 3.

In an embodiment of the present invention, the mask manufacturing method further includes a step of: using a third spraying pressure and a fourth spraying pressure to spray the etching solution on a second surface of the metal substrate, wherein the second surface is opposite to the first surface.

In an embodiment of the present invention, the metal substrate further includes a plurality of virtual zones on the second surface respectively corresponding to the virtual zones on the first surface. The third spraying pressure is equal to the first spraying pressure, and the fourth spraying pressure is equal to the second spraying pressure. The step of using the nozzles to spray the etching solution on the first surface and the second surface of the metal substrate further includes steps of: respectively using the first spraying pressure and the third spraying pressure to spray the etching solution on the corresponding virtual zones of the first surface and the second surface of the metal substrate, and respectively using the second spraying pressure and the fourth spraying pressure to spray the etching solution on the corresponding virtual zones on the first surface and the second surface of the metal substrate.

In an embodiment of the present invention, the first spraying pressure, the second spraying pressure, the third spraying pressure, and the fourth spraying pressure are 0.1-0.3 Mpa, and the etching solution has a concentration of 40-50% and contains ferric chloride and hydrochloric acid.

In an embodiment of the present invention, the metal substrate has a thickness of 15-50 μm, and the first thickness and the second thickness have a thickness difference greater than or equal to 1.2 μm.

In an embodiment of the present invention, the mask manufacturing method further includes a step of: forming a thinned metal plate, wherein the metal plate has a thickness difference less than 1.2 μm between different unit areas.

In an embodiment of the present invention, the mask manufacturing method further includes a step of: etching the metal plate to form a plurality of openings, wherein sizes of the openings are substantially the same.

The present invention also provides a mask manufacturing device, which can be used to produce masks with high uniformity of openings and better quality.

The mask manufacturing device provided by the present invention includes an etching unit and a feeding unit. The etching unit includes a plurality of tubes and a plurality of nozzles. The tubes are arranged side by side and used for allowing an etching solution to be filled in the tubes. The nozzles are arranged at intervals and staggeredly on the tubes. The nozzles are communicated with the respective tubes. The nozzles are used to receive the etching solution from the respective tubes and respectively spray the etching solution with a spraying pressure. The feeding unit is used to convey a metal substrate to pass through the etching unit to receive the etching solution sprayed by the nozzles.

In an embodiment of the present invention, each of the nozzles forms a spraying range on a surface of the metal substrate when spraying the etching solution, and the adjacent spraying ranges are adjacently connected to each other.

In an embodiment of the present invention, the spraying ranges are substantially circular, and the adjacent spraying ranges are overlapped at a position where the adjacent spraying ranges are adjacently connected.

In an embodiment of the present invention, the feeding unit includes a conveyor belt for carrying and conveying the metal substrate, the etching unit is arranged on opposite sides of the conveyor belt, and the nozzles spray the etching solution from the opposite sides of the conveyor belt.

In an embodiment of the present invention, the adjacent tubes are 110-130 mm apart, and the adjacent nozzles on the each of the tubes are 75-85 mm apart.

In an embodiment of the present invention, the mask manufacturing device further includes a control unit used for adjusting the spraying pressure so that the nozzles can spray the etching solution with the same or different spraying pressures.

The present invention uses a plurality of nozzles to spray the etching solution, and the nozzles can spray the etching solution on different virtual zones on a surface of a metal substrate with a larger spraying pressure such as the first spraying pressure and a smaller spraying pressure such as the second spraying pressure. The difference in the thickness of the metal substrate can be adjusted so that the uniformity of the mask openings and the quality of mask can be improved.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The above and other technical contents, features and effects will be described in more detail with reference to appended figures in the following detailed description of a preferred embodiment. Directional terminology which will be mentioned in the following embodiments, such as "top", "bottom", "front", "back", etc., is merely used with reference to the orientation of the Figure(s). As such, the directional terminology is used for purposes of illustration and is in no way limiting.

Figure 1:
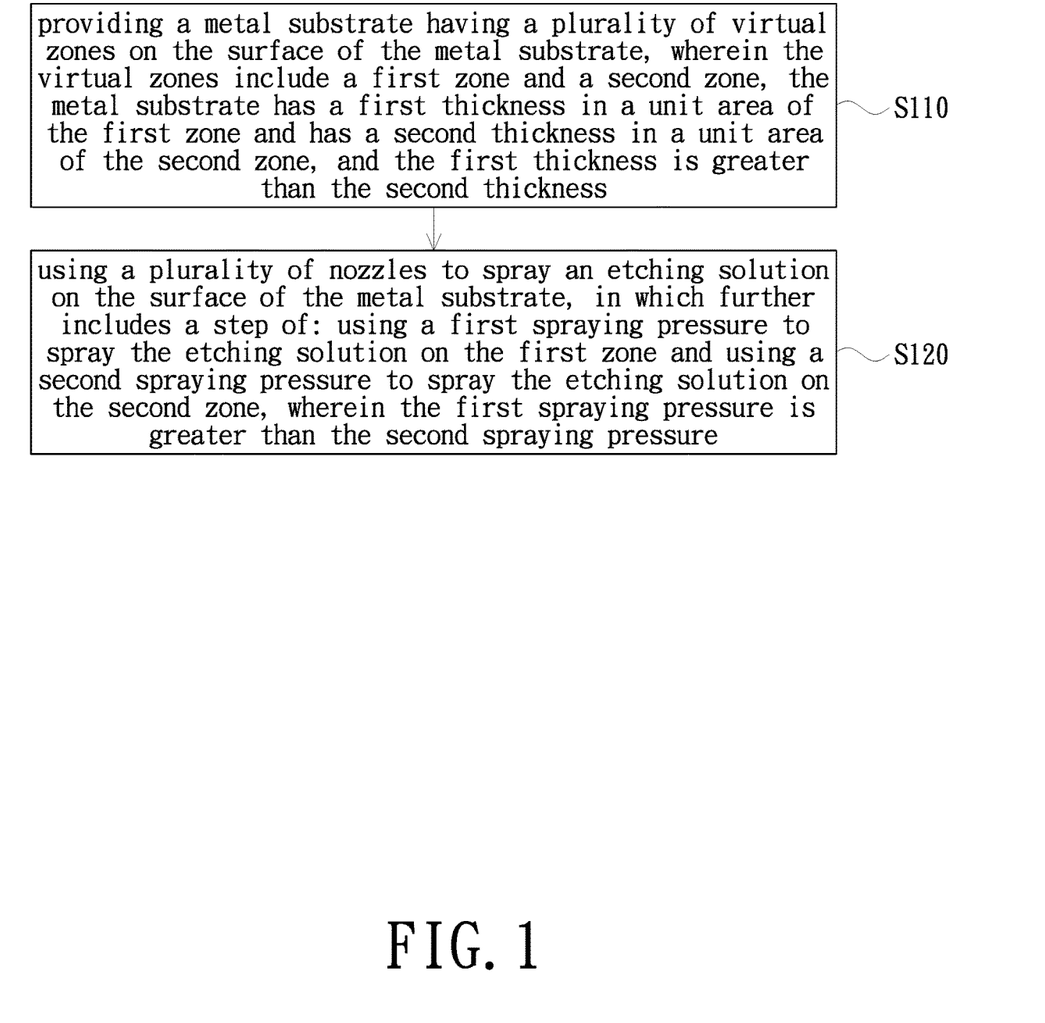
FIG. 1 is a schematic flow chart of a mask manufacturing method in accordance with an embodiment of the invention.

The present invention provides a mask manufacturing method. As shown in FIG. 1, the mask manufacturing method includes steps of: providing a metal substrate having a plurality of virtual zones on the surface of the metal substrate (step S110); and using a plurality of nozzles to spray etching solution on the surface of the metal substrate (step S120). In addition, the mask manufacturing method of the present invention may further include a step of: etching to form a mask with a plurality of openings.

The metal substrate in the step S110 is the material for manufacturing the mask. In an embodiment of the present invention, the metal substrate is an alloy such as nickel-iron alloy and may be uneven in thickness. For example, the thickness of the metal substrate is 15-50 μm, and the difference between the thickest part and the thinnest part (or the difference in thickness, or thickness difference) is more than 1.2 μm. In addition, the step S110 may further include a step of: measuring the thickness of the metal substrate. In other embodiments, the step S110 can be performed on the metal substrate whose thickness has been measured.

Figure 2:
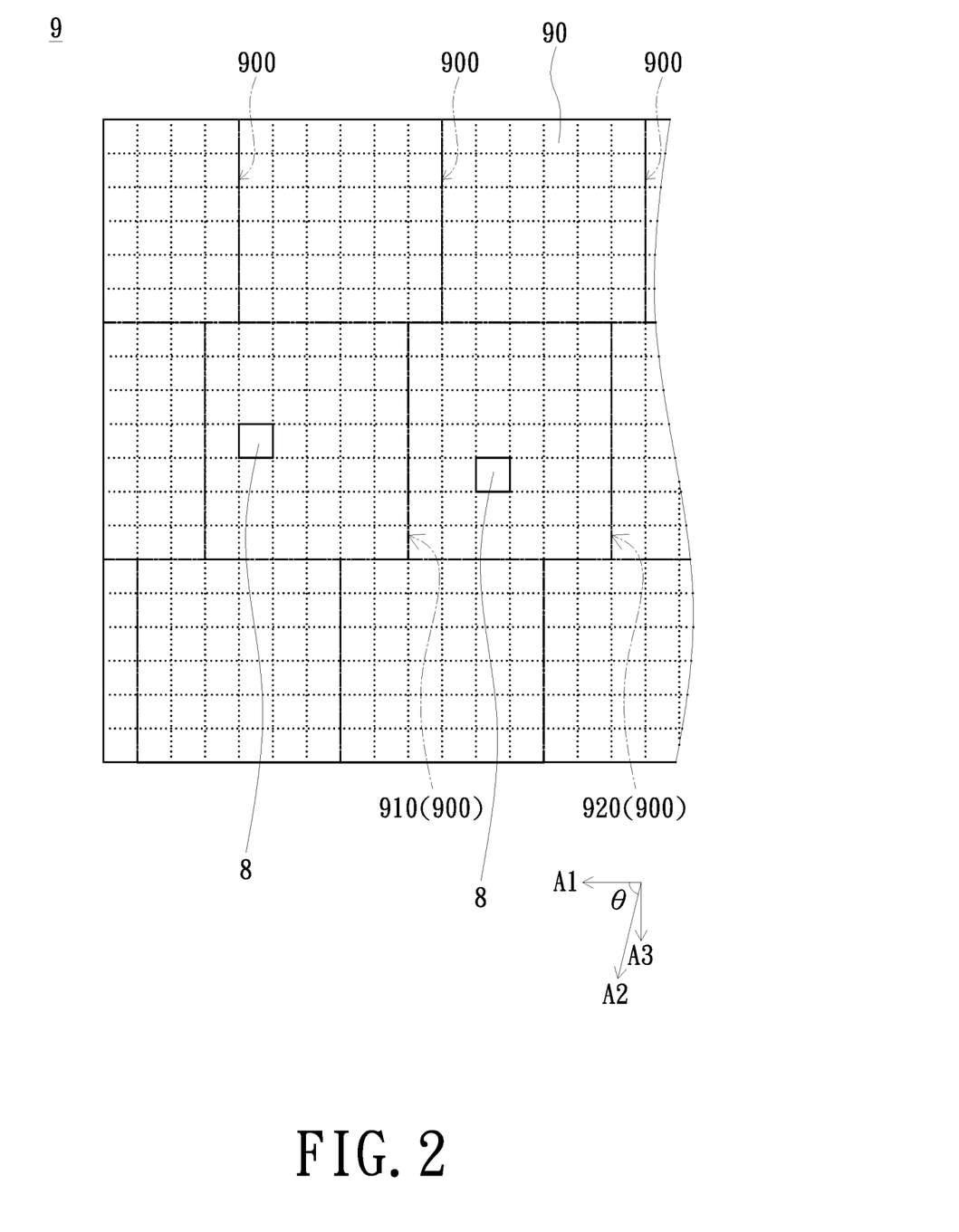
FIG. 2 is a schematic diagram of a surface of a metal substrate in accordance with an embodiment of the invention.

Because the method of thickness measurement is well known, no redundant detail is to be given herein. FIG. 2 is a schematic diagram of a surface of a metal substrate in accordance with an embodiment of the invention. Preferably, as shown in FIGS. 1 and 2, the thickness of the metal substrate 9 of the embodiment of the present invention can be acquired by a thickness measurement to obtain the thicknesses of different virtual zones 900 (will be described in detail later) on the surface 90 of the metal substrate 9, such as the thicknesses of the first zone 910 and the second zone 920 (will be described in detail later), wherein the thickness of the first zone 910 and the thickness of the second zone 920 may be different. In addition, each virtual zone 900 preferably includes a plurality of unit areas 8, and the size of the unit area 8 can be self-defined. For example, the surface 90 of the metal substrate 9 has an area of (30 cm)×(30 cm) and is divided into 19×19 unit areas, thus, the size of each unit area 8 is approximately 2.493 cm$^2$. If the metal substrate 9 is divided into 20×20 unit areas, the size of each unit area 8 is 2.25 cm$^2$. In an embodiment of the present invention, the unit area 8 of the first zone 910 has a first thickness, and the unit area 8 of the second zone 920 has a second thickness, wherein the first thickness is greater than the second thickness.

The etching solution of step S120 can be selected and deployed in accordance with the metal substrate 9. For example, an etching solution containing ferric chloride and hydrochloric acid is used for the metal substrate 9 of nickel-iron alloy. The nozzles are preferably in the form of a full cone or other forms that can create a solid cone-shaped spray and form a circular spraying range (will be described in detail later) on the target such as the surface 90 of the metal substrate 9. The nozzles of step S120 can be adjusted to, for example, spray the etching solution with different spraying pressures. Increasing the spraying pressure can increase the amount of etching solution. The spraying pressure can be adjusted according to, for example, the thickness of the metal substrate 9 and the concentration of the etching solution.

In an embodiment of the present invention as shown in FIG. 1, the nozzles in step S120 further include a first nozzle and a second nozzle. The first nozzle and the second nozzle respectively use the first spraying pressure and the second spraying pressure to spray the etching solution on the surface 90 of the metal substrate 9, wherein the first spraying pressure is greater than the second spraying pressure. "Respectively" herein means that the first nozzle and the second nozzle spray etching solution on different areas (such as different virtual zones 900) on the surface 90. Because the thickness of the first zone 910 is greater than the thickness of the second zone 920, the first nozzle can spray the etching solution to the first zone 910 at the first spraying pressure and the second nozzle can spray the etching solution to the second zone 920 at the second spraying pressure, wherein the amount of etching solution sprayed by the first nozzle is greater than the amount of etching solution sprayed by the second nozzle.

Preferably, the plurality of virtual zones 900 on the surface 90 of the metal substrate 9 are arranged and adjacently connected to each other in a direction. In an embodiment of the present invention as shown in FIG. 2, the plurality of virtual zones 900 are arranged in a row along a first direction A1 and also the virtual zones 900 are arranged and adjacently connected to each other approximately along a second direction A2. It is known that the virtual zones 900 are areas planned on the surface 90 mainly responding to the spraying of etching solution from the nozzles, thus, the number of virtual zones 900 should increase with the increasing number of the nozzles. In addition, it is also known that the number of the virtual zones 900 increases and the size of each virtual zone 900 becomes smaller when the nozzles are arranged densely. The shapes or sizes of the virtual zones 900 are approximately the same, but the invention is not limited thereto. In an embodiment of the present invention as shown in FIG. 2, the virtual zone 900 includes a plurality of rectangular areas with the same or similar area and shape.

Figure 3:
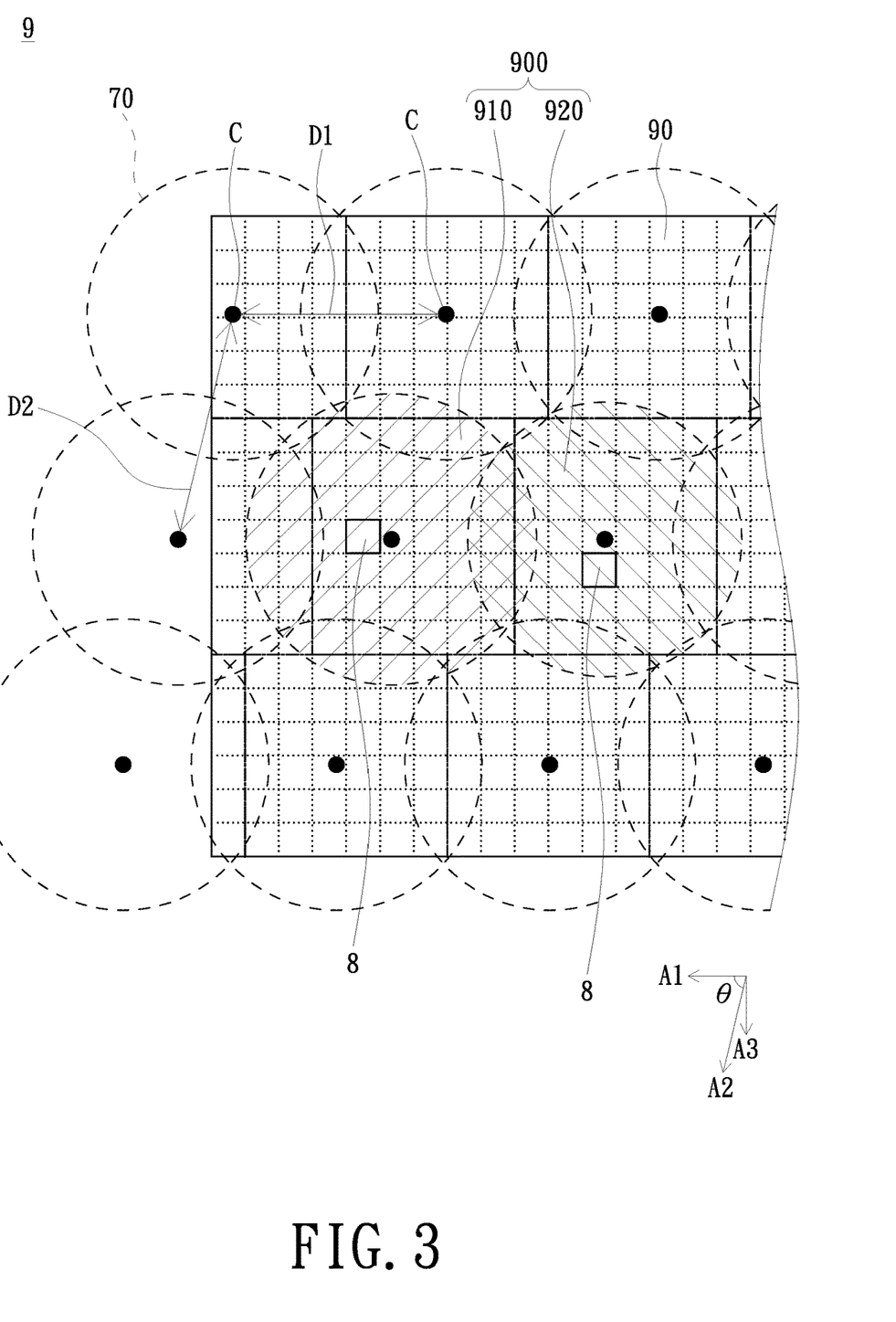
FIG. 3 is a schematic diagram of an implementation of a mask manufacturing method in accordance with an embodiment of the invention.

FIG. 3 illustrates the relationship between the spraying ranges 70 and the virtual zones 900. As shown in FIG. 3, the spraying range 70 of each nozzle approximately corresponds to the respective virtual zone 900. For example, the spraying range 70 of the first nozzle corresponds to the first zone 910, and the spraying range 70 of the second nozzle corresponds to the second zone 920. If the nozzle is in the form of a full cone and the etching solution is sprayed perpendicularly to the surface 90, the spraying range 70 formed by the nozzle is substantially circular, wherein the center C (equivalent to the center of the circle) of the spraying range 70 is approximately aligned with the nozzle. The adjacent spraying ranges 70 are adjacently connected to each other and preferably overlapped at the position where the adjacent spraying ranges 70 are adjacently connected. Therefore, the surface 90 can be completely covered by the etching solution spraying ranges.

As shown in FIG. 3, the spraying ranges 70 are arranged in a row along the first direction A1. Furthermore, the spraying ranges 70 are arranged in a staggered manner along the second direction A2, for example, wherein the first direction A1 is not perpendicular to the second direction A2. As such, the spraying ranges 70 of the upper row and the lower row are staggered, so that the efficiency of the etching solution covering the surface 90 is improved.

The different virtual zones 900 may have different thicknesses, each nozzle can spray the etching solution with its adjustable spraying pressure, and the spraying range 70 approximately corresponds to the respective virtual zone 900. Therefore, the spraying pressure of each nozzle can be set according to the thickness of the respective virtual zone 900 or the thickness of the unit area 8 therein on the surface 90, so that the amount of etching solution among the different spraying ranges 70 can be different.

In addition to the spraying pressure of the nozzles and the concentration of the etching solution, the spacing distance between the adjacent spraying ranges 70 in the first direction A1 or the second direction A2, the size of the spraying range 70, the degree of overlapping among the spraying ranges 70, etc., are all parameters that can be adjusted according to the metal substrate 9, so that the thickness of the metal substrate 9 is reduced through the steps S110 to S120, and the thickness is less different and more even. The spraying pressure of the nozzle, the concentration of the etching solution, and the spacing distance are further illustrated as follows:

(1) the spraying pressure of the nozzle: 0.1-0.3 Mpa;
(2) the concentration of the etching solution: 40-50%;
(3) the spacing distance: centers of the two adjacent spraying ranges 70 in the first direction A1 are 75-85 mm apart, and centers of the two adjacent spraying ranges 70 in the second direction A2 are 120-145 mm apart. The second direction A2 has a component in the first direction A1 and a component in the third direction A3, and the third direction A3 is perpendicular to the first direction A1. In addition, the angle between the first direction A1 and the second direction A2 can be represented by $\theta$, wherein $\tan\theta$ is preferably greater than 3 or less than 3.

After a test, for the 30 cm×30 cm metal substrate 9 with a thickness of 40 μm and a thickness difference of 1.7 μm, the use of the parameters in (1)-(3) can improve its uniformity and reduce the thickness difference to less than 1.2 μm.

Figure 6:
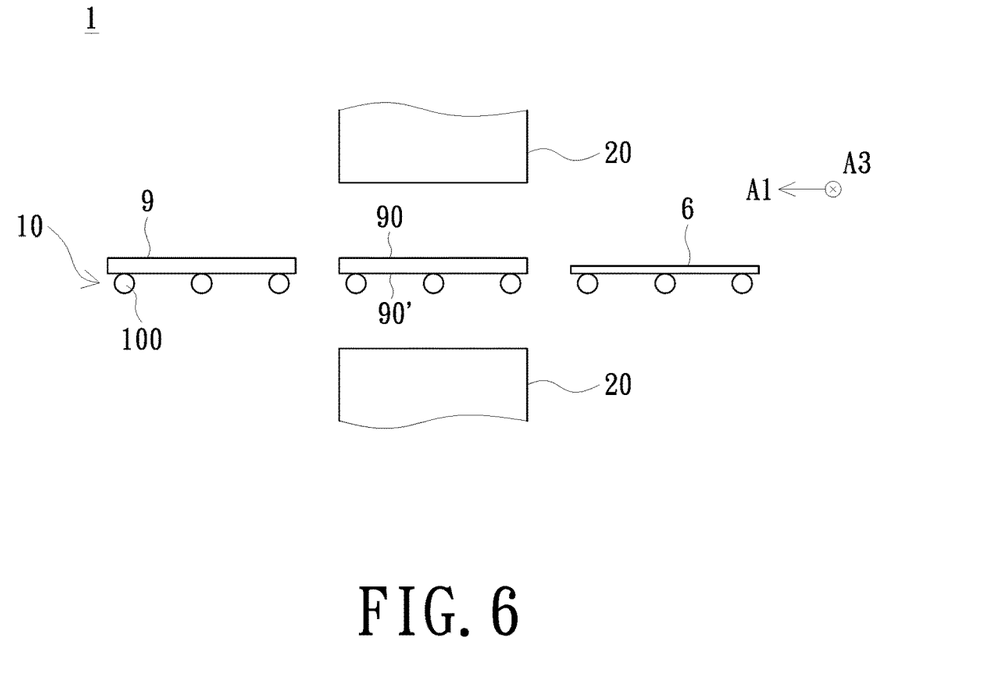
FIG. 6 is a schematic side view of a mask manufacturing device in accordance with an embodiment of the invention.

The step S120 may further include a step of: using a plurality of nozzles to spray the etching solution on the other surface 90' of the metal substrate. The other surface 90' of the metal substrate 9 (please refer to FIG. 6) may include a plurality of virtual zones (not shown) respectively corresponding to the plurality of virtual zones 900 of the surface 90. Furthermore, among the plurality of nozzles, each two nozzles are paired to respectively spray the etching solution to the two corresponding virtual zones on the two opposite surfaces of the metal substrate 9. The pair of the nozzles can use the same spraying pressure to spray the etching solution on the two opposite surfaces of the metal substrate 9. For example, the pair of the nozzles (such as the first nozzle and the third nozzle) respectively use the first spraying pressure and the third spraying pressure to spray the etching solution to the two corresponding virtual zones on the two opposite surfaces of the metal substrate, wherein the third spraying pressure is equal to the first spraying pressure. The second nozzle and the fourth nozzle respectively use the second spraying pressure and the fourth spraying pressure to spray the etching solution on the two corresponding virtual zones on the two opposite surfaces of the metal substrate, wherein the second spraying pressure is equal to the fourth spraying pressure. After a test to a 30 cm×30 cm metal substrate which with 40 μm in thickness and 1.7 μm in thickness difference, the uniformity of thickness can be acquired by performing the parameters (1)-(3) on the two opposite surfaces and the thickness difference can be reduced to less than 1.2 μm. Because the thickness of the metal substrate 9 is relatively uniform after the steps S110 to S120, the unevenness of size and shape of the openings can be reduced and the quality of the mask can be improved in the step of etching to form a mask with a plurality of openings. In several tests, an embodiment of the present invention can improve the thickness difference from 1.7 μm to 0.8 μm, which can improve thickness uniformity from 97.86% to 98.37% and the uniformity of the size of the openings of the mask from 94.67% to 97.36%.

Figure 4:
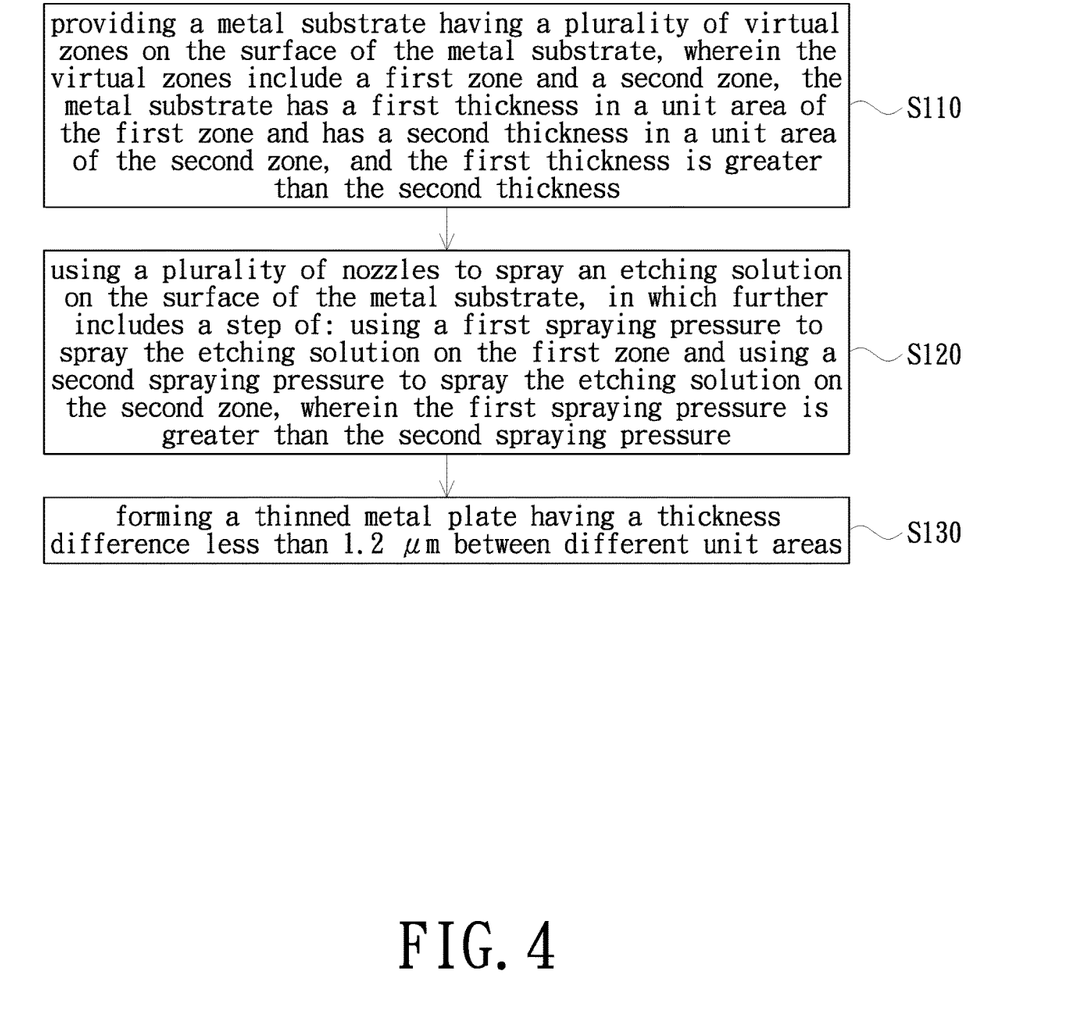
FIG. 4 is a schematic flow chart of a mask manufacturing method in accordance with another embodiment of the invention.

As shown in FIG. 4, the mask manufacturing method of the present invention may further include a step S130: forming a thinned metal plate. The thinned metal plate has a smaller thickness difference than the metal substrate. In an embodiment of the present invention, preferably, the metal plate has a thickness difference less than 1.2 μm among the different unit areas 8. In other word, the metal plate is not only thinner than the metal substrate 9, but also has a more even thickness.

Figure 5:
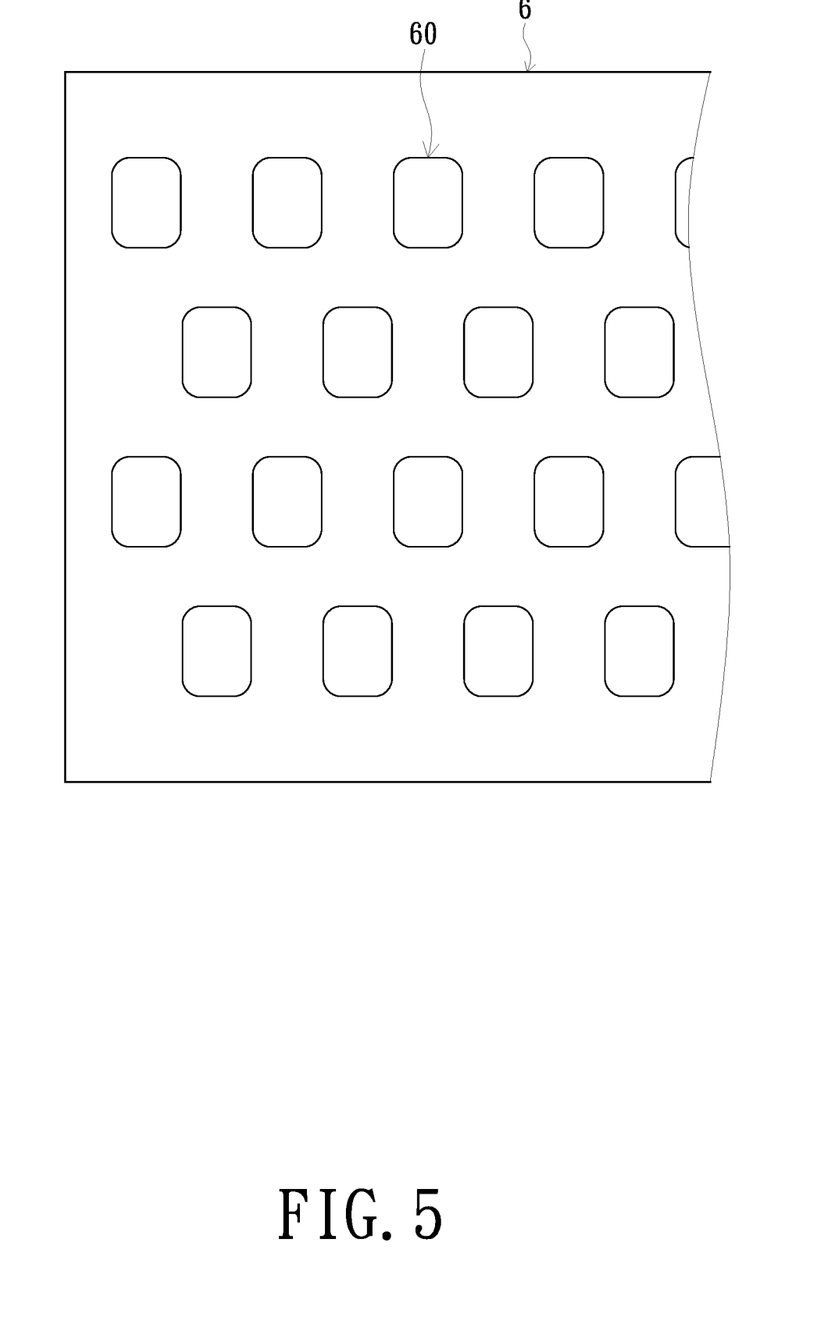
FIG. 5 is a schematic diagram of a metal plate in accordance with an embodiment of the invention.

The step S130 may further include a step of: etching the metal plate to form a plurality of openings. FIG. 5 illustrates a metal plate 6 and its openings 60 formed by the steps S110 to S130. As described above, the metal plate 6 is thinner and more even in thickness. Therefore, the size and shape of the openings formed by the step S130 are more even and substantially the same, and thus the quality of the mask is better.

The present invention also provides a mask manufacturing device. As the embodiment shown in FIG. 6, the mask manufacturing device 1 includes an etching unit 20 and a feeding unit 10. The etching unit 20 includes a plurality of tubes and a plurality of nozzles. The tubes are arranged side by side and used for allowing an etching solution to be filled therein. The nozzles are arranged at intervals and staggeredly on the tubes and communicated with the respective tubes. The nozzles receive the etching solution from the respective tubes and respectively spray the etching solution with adjustable spraying pressure. The aforementioned mask manufacturing method can be implemented, for example, on the mask manufacturing device 1 of this embodiment. The mask manufacturing device 1 may further include a control unit (not shown) such as a computer, etc. The control unit is used to adjust the spraying pressure of each nozzle so that the nozzles can spray the etching solution at the same or different spraying pressures.

Figure 7:
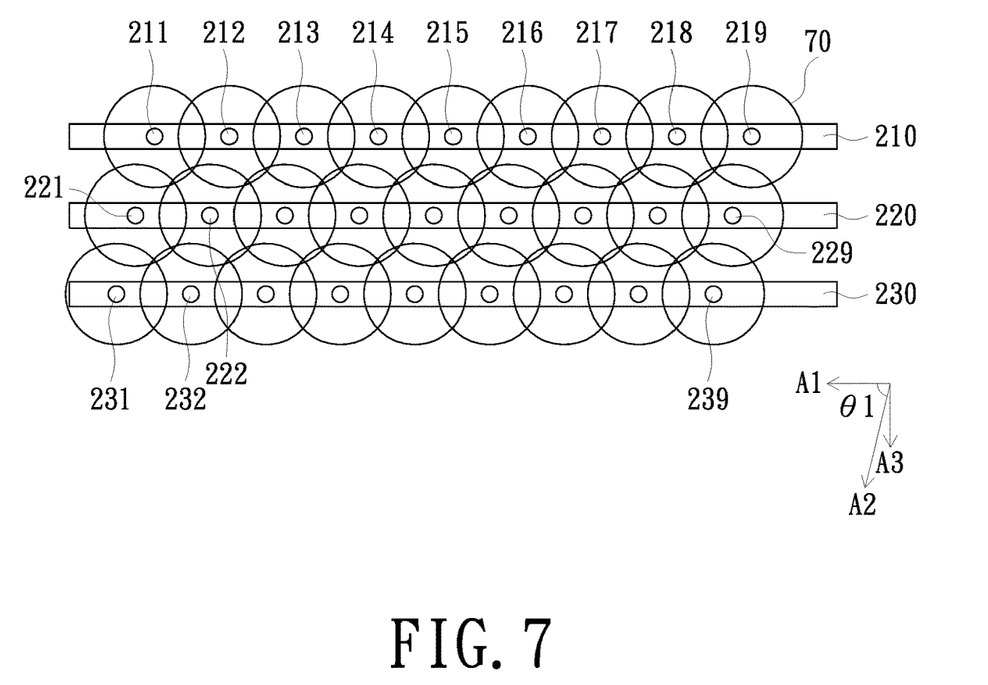
FIG. 7 is a schematic diagram of a part of an etching unit in accordance with an embodiment of the invention.

Please refer to FIG. 7 for the positional relationship of the tubes and the nozzles. In an embodiment of the present invention as shown in FIG. 7, the etching unit 20 includes three tubes 210-230 and twenty seven nozzles 211-219, 221-229, and 231-239. The tubes 210-230 are arranged along the third direction A3, and the distance between the adjacent two tubes is, for example, 110-130 mm Each tube 210, 220, 230 is provided with nine nozzles 211-219, 221-229, 231-239, and the nozzles of each tube 210, 220, 230 may be arranged along the same direction (such as the first direction A1). The first direction A1 and the third direction A3 are perpendicular to each other, and the distances between the nozzles on each tube 210, 220 or 230 can be the same, wherein the distance is, for example, 75-85 mm. In addition, the first nozzles (nozzle 211, 221, 231) of the tubes, the second nozzles (nozzle 212, 222, 232) of the tubes . . . and the ninth nozzles (nozzle 219, 229, 239) of the tubes can also be arranged along the same direction (such as the second direction A2). The second direction A2 is non-perpendicular to the first direction A1. Thus, the nozzle 221 is offset relative to the nozzle 211 in the first direction A1, the nozzle 231 is offset relative to the nozzle 221 in the first direction A1, and other nozzles have the same manner, so that the staggered arrangements of the nozzles 211-219, 221-229, and 231-239 are formed. The nozzles 211-219, 221-229, and 231-239 are preferably in the form of a full cone to form a solid cone spray. When the nozzle sprays the etching solution towards any surface, a substantially circular spraying range 70 can be formed on the surface. In addition, the corresponding spraying ranges 70 can be adjacently connected to each other where the nozzles (such as nozzles 211 and 212, 211 and 221, or 211 and 222) are adjacent to each other.

The feeding unit 10 is used to convey the metal substrate 9 to pass through the etching unit 20 to receive the etching solution sprayed by the nozzles such as the nozzles 211-219, 221-229, and 231-239, wherein the metal substrate 9 is a material for manufacturing the mask and its thickness may be uneven. For example, the thickness of the metal substrate 9 is 15-50 μm and the thickness difference between the thickest part and the thinnest part is more than 1.2 μm. In an embodiment of the present invention, the feeding unit 10 includes a conveyor belt 100 for carrying and conveying the metal substrate 9. The conveyor belt 100 uses rollers to carry and convey the metal substrate 9. The number of the etching units 20 can be two. The two etching units 20 are respectively arranged on the opposite sides of the conveyor belt 100. The nozzles 211-219, 221-229, and 231-239 of the upper etching unit 20 spray the etching solution toward the surface 90 of the metal substrate 9, and the nozzles 211-219, 221-229, and 231-239 of the lower etching unit 20 spray the etching solution toward the surface 90' of the metal substrate 9. The nozzles 211-219, 221-229, and 231-239 of the upper (or lower) etching unit 20 are further from the surface 90 (or the surface 90') by an appropriate distance, and the spraying ranges 70 of the adjacent nozzles (such as nozzles 211 and 212, 211 and 221, or 211 and 222) on the surface 90 (or the surface 90') can be further overlapped. The overlapped condition is shown in FIG. 7; however, it is known that ratio of the overlapped area to the spraying ranges 70 may be different from that in FIG. 7 in other embodiments.

The conveyance of the metal substrate 9 can be temporarily stop when the metal substrate 9 is conveyed to the etching unit 20 by the conveyor belt 100, and the upper and lower etching units 20 can respectively spray the etching solution toward the surfaces 90 and 90'. The nozzles 211-219, 221-229, 231-239 can spray the etching solution with the same or different spraying pressures. When the spraying pressure is higher, the amount of etching solution within the formed spraying range 70 can be larger. The spraying pressure of the nozzles for spraying the etching solution is, for example, 0.1-0.3 Mpa. For instance, the spraying pressures of the nozzles 211-219, 221-229, 231-239 can be adjusted according to the thicknesses of different virtual zones (please refer to FIGS. 2-3) on the surface 90 of the metal substrate 9 as follows:

| | nozzle | 211 | 212 | 213 | 214 | 215 | 216 | 217 | 218 | 219 |
|---|---|---|---|---|---|---|---|---|---|---|
| Tube 210 | Spraying pressure (Mpa) | 0.2 | 0.23 | 0.2 | 0.2 | 0.2 | 0.2 | 0.2 | 0.23 | 0.2 |
| | nozzle | 221 | 222 | 223 | 224 | 225 | 226 | 227 | 228 | 229 |
| Tube 220 | Spraying pressure (Mpa) | 0.2 | 0.2 | 0.2 | 0.2 | 0.2 | 0.2 | 0.2 | 0.2 | 0.2 |
| | nozzle | 231 | 232 | 233 | 234 | 235 | 236 | 237 | 238 | 239 |
| Tube 230 | Spraying pressure (Mpa) | 0.2 | 0.22 | 0.2 | 0.2 | 0.2 | 0.25 | 0.2 | 0.2 | 0.2 |

In addition, the nozzles of the upper and the lower etching units 20 may spray the etching solution at the same spraying pressure. Therefore, the corresponding areas of the surfaces 90 and the surface 90' of the metal substrate 9 can receive the same amount of etching solution.

The nozzles 211-219, 221-229, 231-239 can spray the etching solution at the same time. The upper and the lower etching units 20 can also spray the etching solution at the same time. In other embodiments, the upper and the lower etching units 20 can spray the etching solution at different times. Preferably, the plurality of spraying ranges 70 (the overlapped areas are not counted repeatedly) formed by the nozzles 211-219, 221-229, 231-239 are larger than the surface 90 or 90' of the metal substrate 9. The etching of the surface 90 or 90' is completed when the etching solution is sprayed from the nozzles 211-219, 221-229 and 231-239 at the same time. A thinned metal plate 6 can be formed after the etching, and the metal plate 6 has a smaller thickness difference, compared to the metal substrate 9, wherein the thickness difference of the metal plate 6 is, for example, less than 1.2 μm.

The mask manufacturing device 1 may further include a cleaning unit and a drying unit (not shown) for removing the excess etching solution or other liquids on the metal plate 6 (or the metal substrate 9 after etching), so that the metal plate 6 (or the metal substrate 9 after etching) is suitable for the subsequent manufacturing steps. In other embodiments, the mask manufacturing device 1 may further include a unit (not shown) for etching to form a plurality of openings. The unit is used to perform steps such as pressing, exposing, developing, etching, and peeling the film to form a plurality of openings on the metal plate 6 (that is, forming a mask). On the basis of the above description, the mask manufacturing device 1 can provide masks with better quality, and the openings of the mask have higher uniformity in size and shape.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A mask manufacturing method, comprising steps of:
   providing a metal substrate, having a plurality of virtual zones on a first surface, wherein the virtual zones comprise a first zone and a second zone, the metal substrate has a first thickness in a unit area of the first zone and has a second thickness in a unit area of the second zone, and the first thickness is greater than the second thickness; and
   using a plurality of nozzles to spray an etching solution on the first surface of the metal substrate;
   wherein the mask manufacturing method further comprises a step of: using a first spraying pressure to spray the etching solution on the first zone and using a second spraying pressure to spray the etching solution on the second zone, wherein the first spraying pressure is greater than the second spraying pressure.

2. The mask manufacturing method according to claim 1, wherein the virtual zones are arranged and adjacently connected along a first direction, the nozzles spray the etching solution and each nozzle has a spraying range on the first surface, the spraying ranges respectively correspond to the virtual zones, and the adjacent spraying ranges are adjacently connected to each other.

3. The mask manufacturing method according to claim 2, wherein the spraying ranges are arranged and adjacently connected along a second direction, the second direction has a component in the first direction and a component in a third direction, and the third direction is perpendicular to the first direction.

4. The mask manufacturing method according to claim 2, wherein the spraying ranges are substantially circular, and the adjacent spraying ranges are overlapped at a position where the adjacent spraying ranges are adjacently connected.

5. The mask manufacturing method according to claim 1, wherein an amount of the etching solution sprayed by the first spraying pressure is greater than an amount of the etching solution sprayed by the second spraying pressure.

6. The mask manufacturing method according to claim 2, wherein centers of two adjacent spraying ranges in the first direction are 75-85 mm apart.

7. The mask manufacturing method according to claim 3, wherein centers of two adjacent spraying ranges in the second direction are 120-145 mm apart.

8. The mask manufacturing method according to claim 3, wherein an angle between the first direction and the second direction is θ, and tanθ is greater than 3 or less than 3.

9. The mask manufacturing method according to claim 1, further comprising a step of: using a third spraying pressure and a fourth spraying pressure to spray the etching solution on a second surface of the metal substrate, wherein the first surface and the second surface are opposite to each other.

10. The mask manufacturing method according to claim 9, wherein the metal substrate further comprises a plurality of virtual zones on the second surface, the virtual zones on the second surface respectively correspond to the virtual zones on the first surface, the third spraying pressure is equal to the first spraying pressure, the fourth spraying pressure is equal to the second spraying pressure, and the step of using the plurality of nozzles to spray the etching solution on the first surface of the metal substrate and the step of using the third spraying pressure and the fourth spraying pressure to spray the etching solution on the second surface of the metal substrate further comprise steps of:
   respectively using the first spraying pressure and the third spraying pressure to spray the etching solution on the corresponding virtual zones of the first surface and the second surface of the metal substrate; and
   respectively using the second spraying pressure and the fourth spraying pressure to spray the etching solution on the corresponding virtual zones of the first surface and the second surface of the metal substrate.

11. The mask manufacturing method according to claim 9, wherein the first spraying pressure, the second spraying pressure, the third spraying pressure, and the fourth spraying pressure are 0.1-0.3 MPa, and the etching solution has a concentration of 40-50% and contains ferric chloride and hydrochloric acid.

12. The mask manufacturing method according to claim 1, wherein the metal substrate has a thickness of 15-50 μm, and the first thickness and the second thickness have a thickness difference greater than or equal to 1.2 μm.

13. The mask manufacturing method according to claim 1, further comprising a step of: forming a thinned metal plate, wherein the metal plate has a thickness difference less than 1.2 μm between the different unit areas.

14. The mask manufacturing method according to claim 13, further comprising a step of: etching the metal plate to form a plurality of openings, wherein sizes of the openings are substantially the same.

* * * * *